United States Patent [19]
Shinji

[11] Patent Number: 5,627,388
[45] Date of Patent: May 6, 1997

[54] CCD-SOLID STATE IMAGE SENSOR USING ELECTRON AND HOLE SIGNAL CHARGES AND METHOD FOR PROCESSING SIGNAL THEREOF

[75] Inventor: Uya Shinji, Kyungki-do, Rep. of Korea

[73] Assignee: LG Semicon Co., Ltd., Chungcheongbuk-do, Rep. of Korea

[21] Appl. No.: 599,969

[22] Filed: Feb. 14, 1996

[30] Foreign Application Priority Data

Aug. 2, 1995 [KR] Rep. of Korea ............... 23853/1995

[51] Int. Cl.$^6$ ................ H01L 27/148; H01L 29/768
[52] U.S. Cl. ............ 257/223; 257/224; 257/246; 257/248; 257/912; 257/231
[58] Field of Search ................ 257/222, 223, 257/224, 229, 230, 231, 246, 248, 912

[56] References Cited

U.S. PATENT DOCUMENTS

| | | | |
|---|---|---|---|
| 3,896,484 | 7/1975 | Nishizawa et al. | 257/912 |
| 3,996,599 | 12/1976 | King | 257/229 |
| 4,223,329 | 9/1980 | Jambotkar | 257/912 |
| 4,468,684 | 8/1984 | Esser et al. | 257/222 |
| 5,309,004 | 5/1994 | Grudkowski | 257/222 |
| 5,359,213 | 10/1994 | Lee et al. | 257/223 |

FOREIGN PATENT DOCUMENTS

| | | | |
|---|---|---|---|
| 3418778 | 11/1985 | Germany | 257/912 |
| 53-127276 | 11/1978 | Japan | 257/912 |
| 535604 | 11/1976 | U.S.S.R. | 257/912 |

Primary Examiner—Gene M. Munson
Attorney, Agent, or Firm—Morgan, Lewis and Bockius LLP

[57] ABSTRACT

A CCD-solid state image sensor includes a sensing area for generating signal charges in response to incident light, a storage area for storing the signal charges from the sensing area, an HCCD (Horizontal Charge Coupled Device) for extracting the signal charges stored in the storage area, a high sensitivity signal charge detection and amplification circuit for detecting and amplifying signal charges of electrons from the HCCD, and a low sensitivity signal charge detection and amplification circuit for detecting and amplifying signal charges of holes from the HCCD.

20 Claims, 16 Drawing Sheets

F I G.1
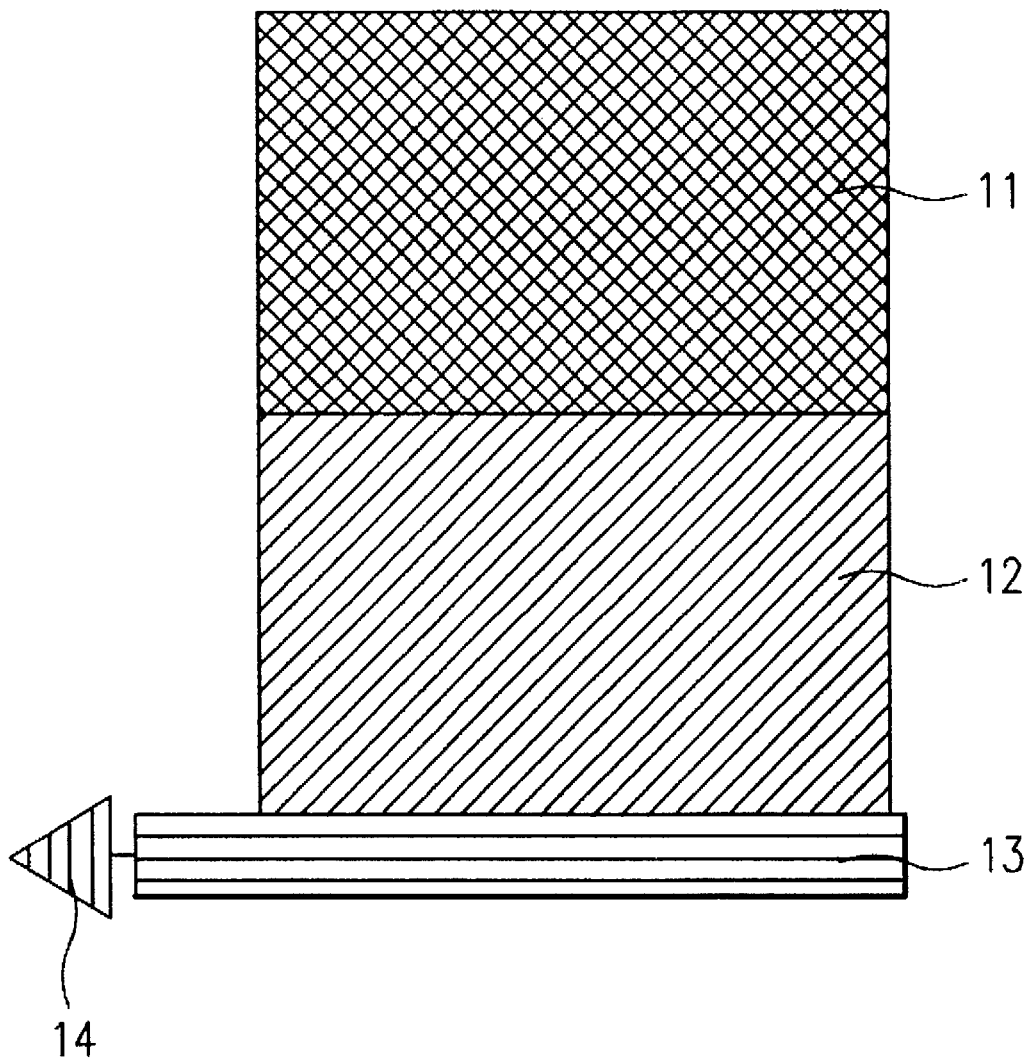

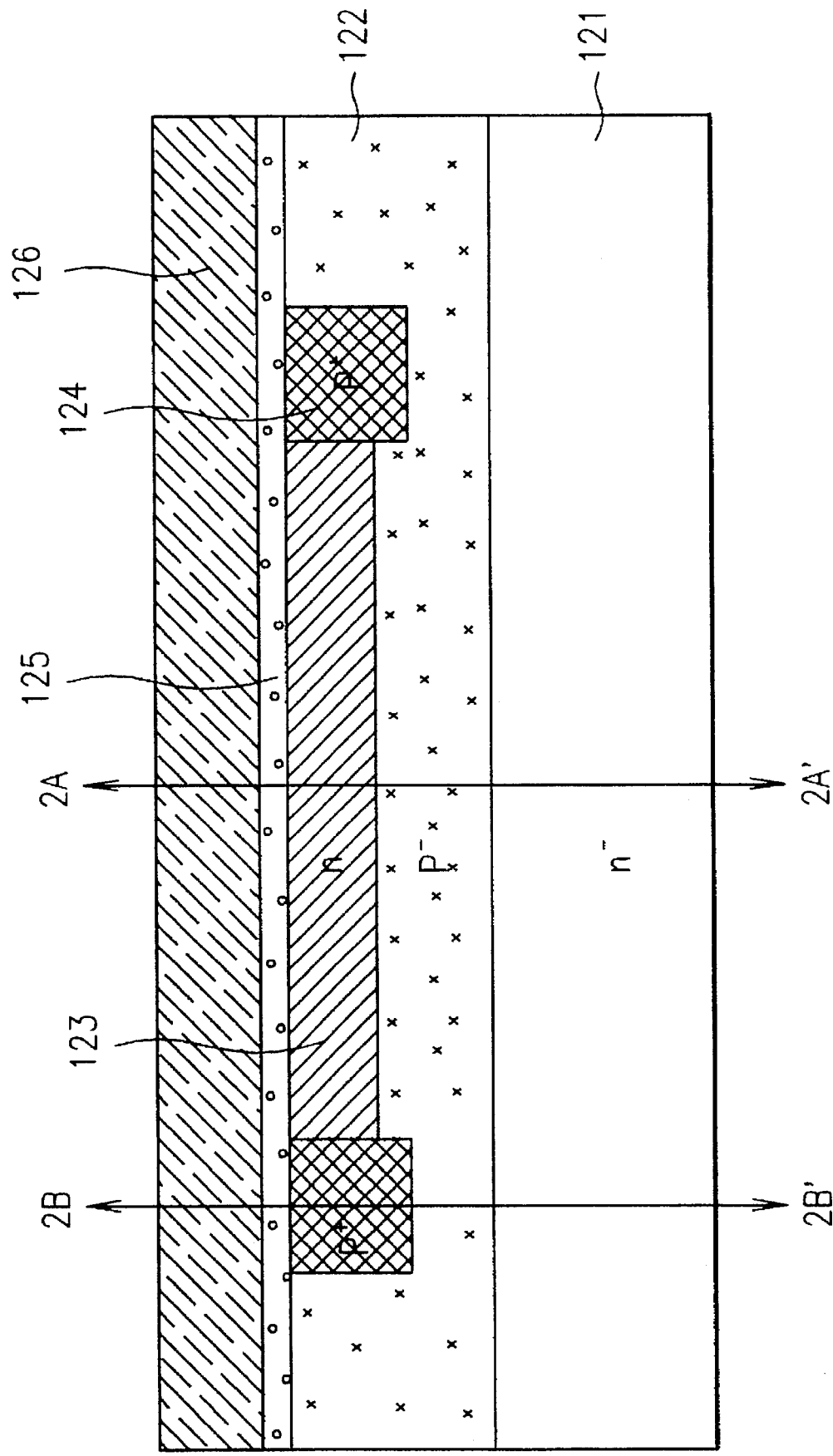

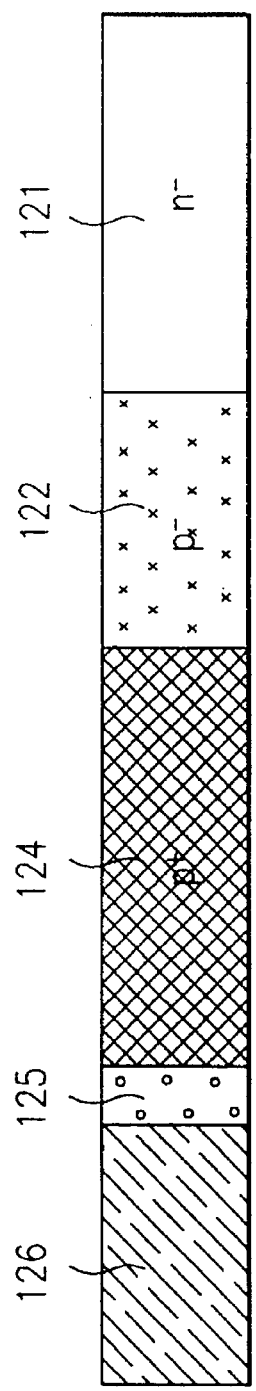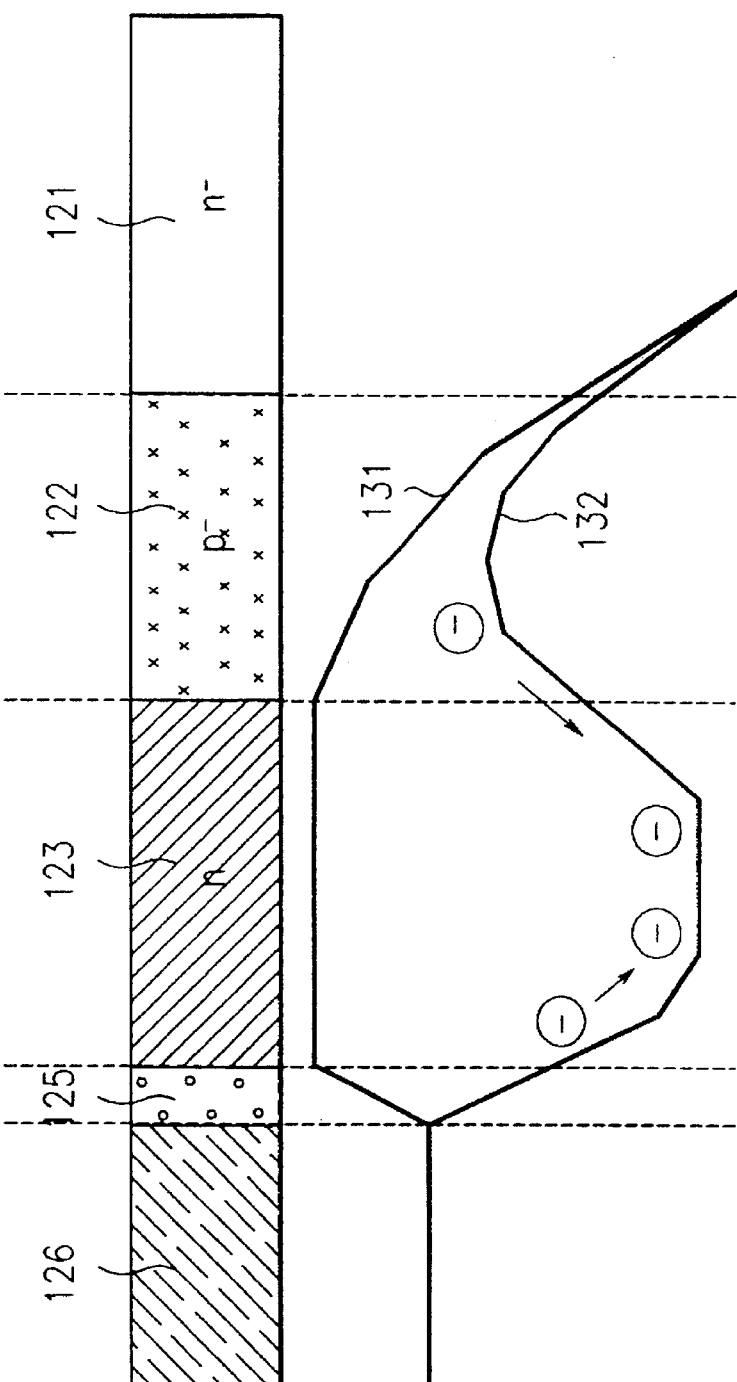
FIG. 3A  FIG. 3B  FIG. 3C

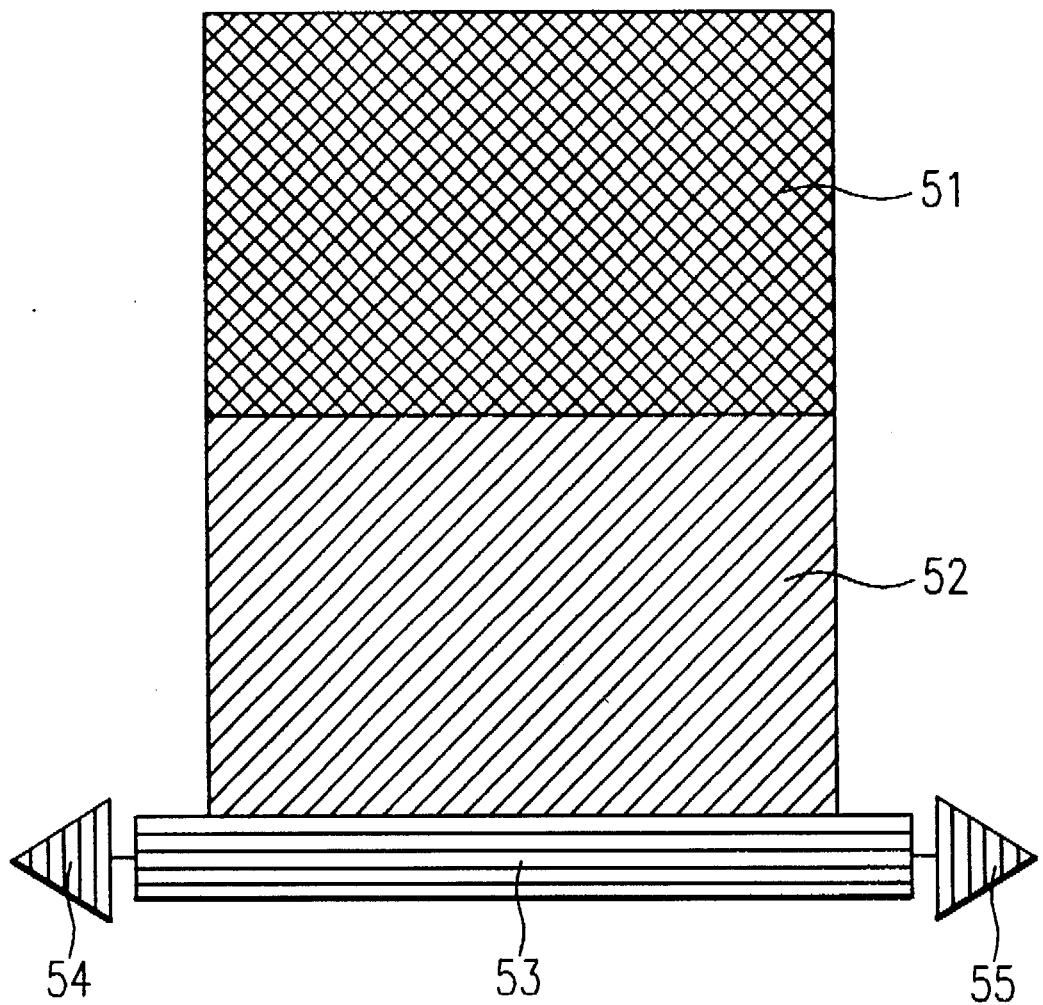
F I G.5

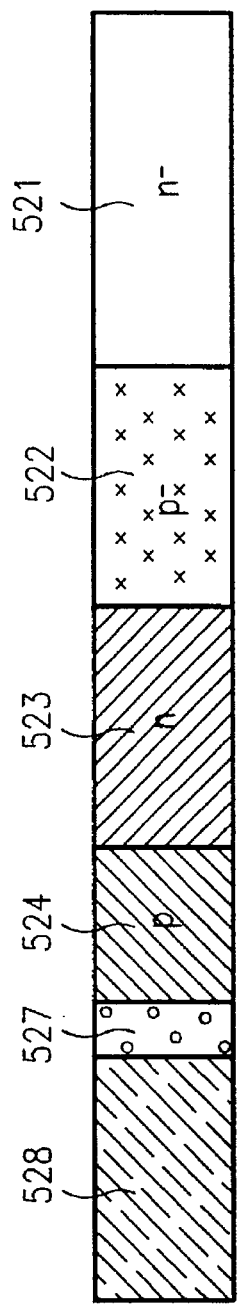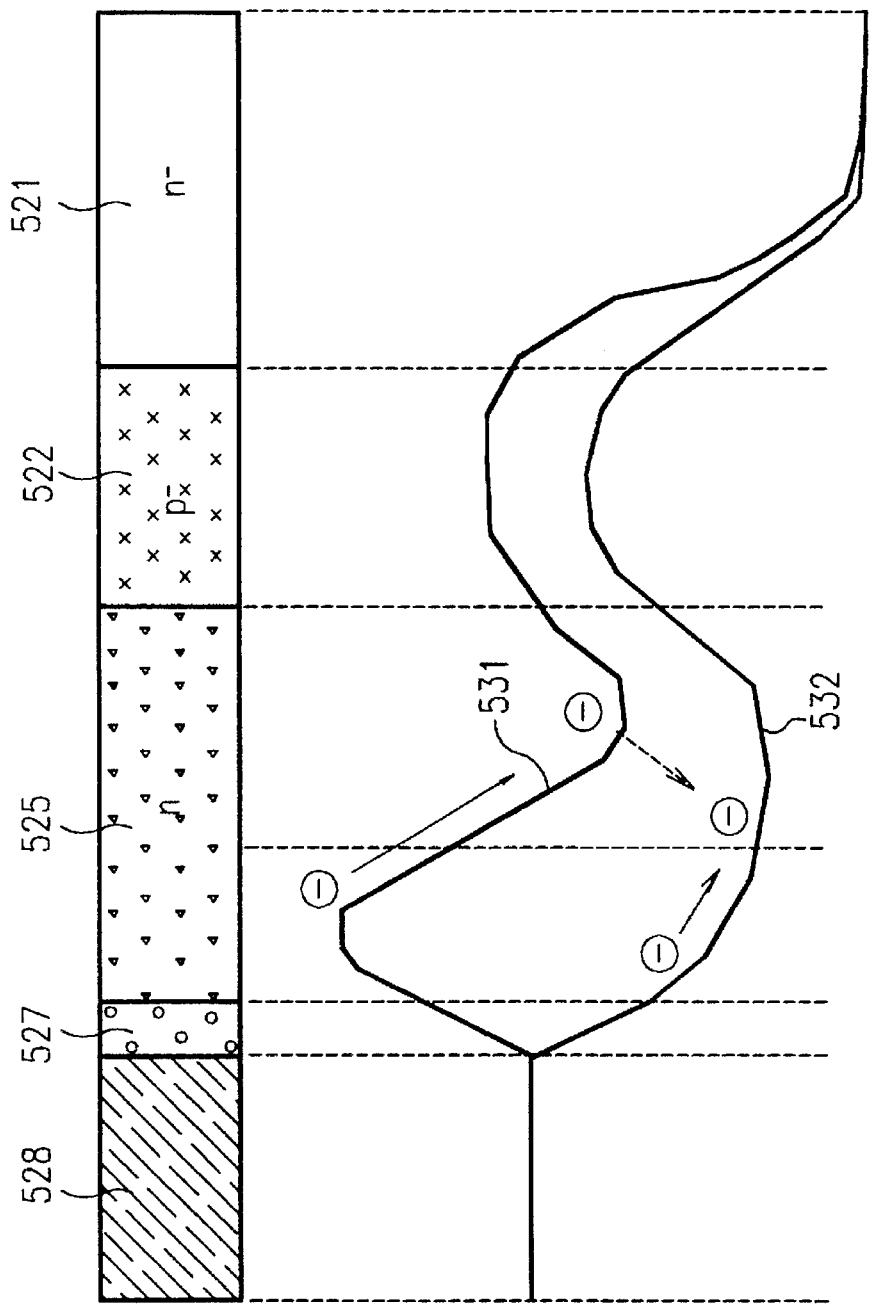
FIG. 8A (5A-5A')
FIG. 8B (5B-5B')
FIG. 8C

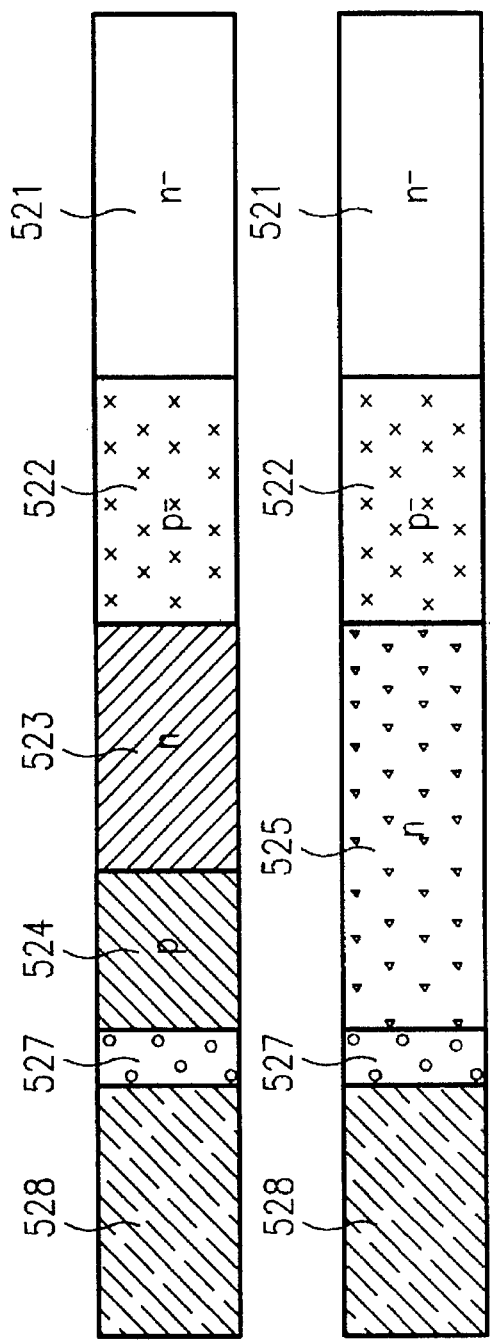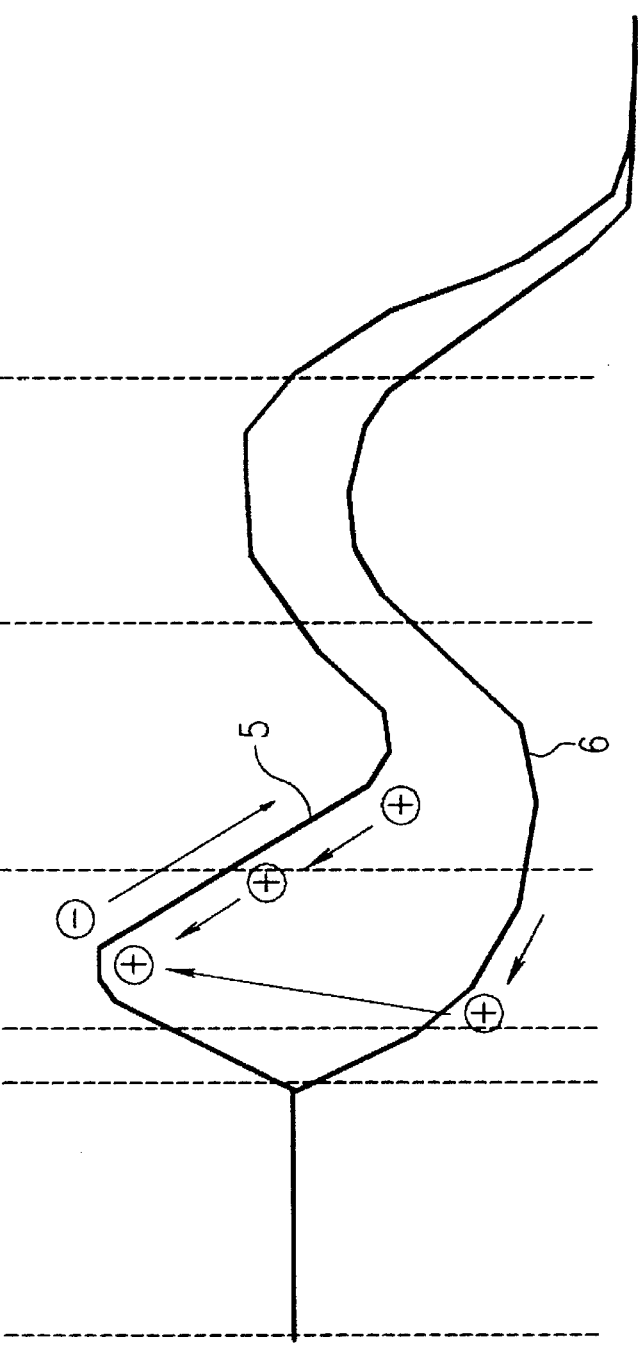
F I G. 9A (5A-5A')
F I G. 9B (5B-5B')
F I G. 9C

FIG.10A (5C-5C')

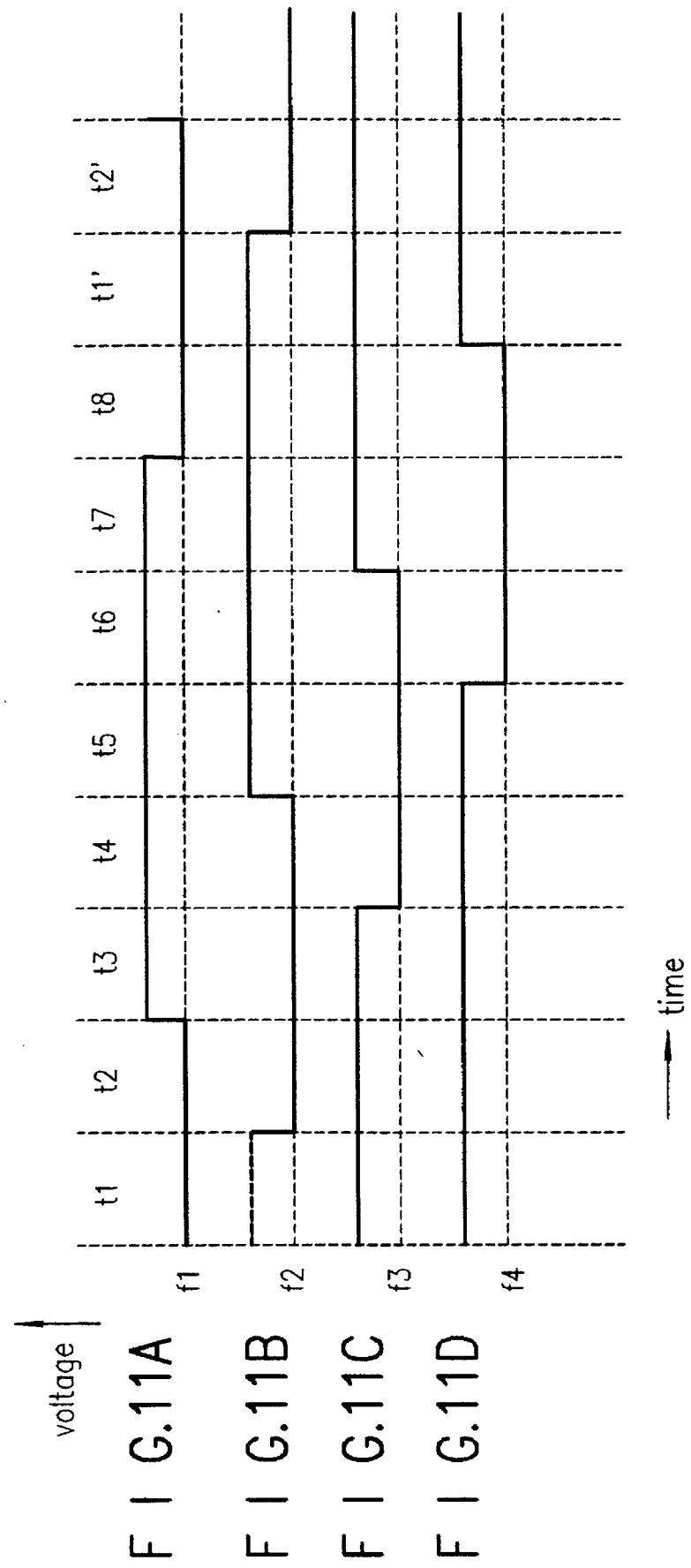

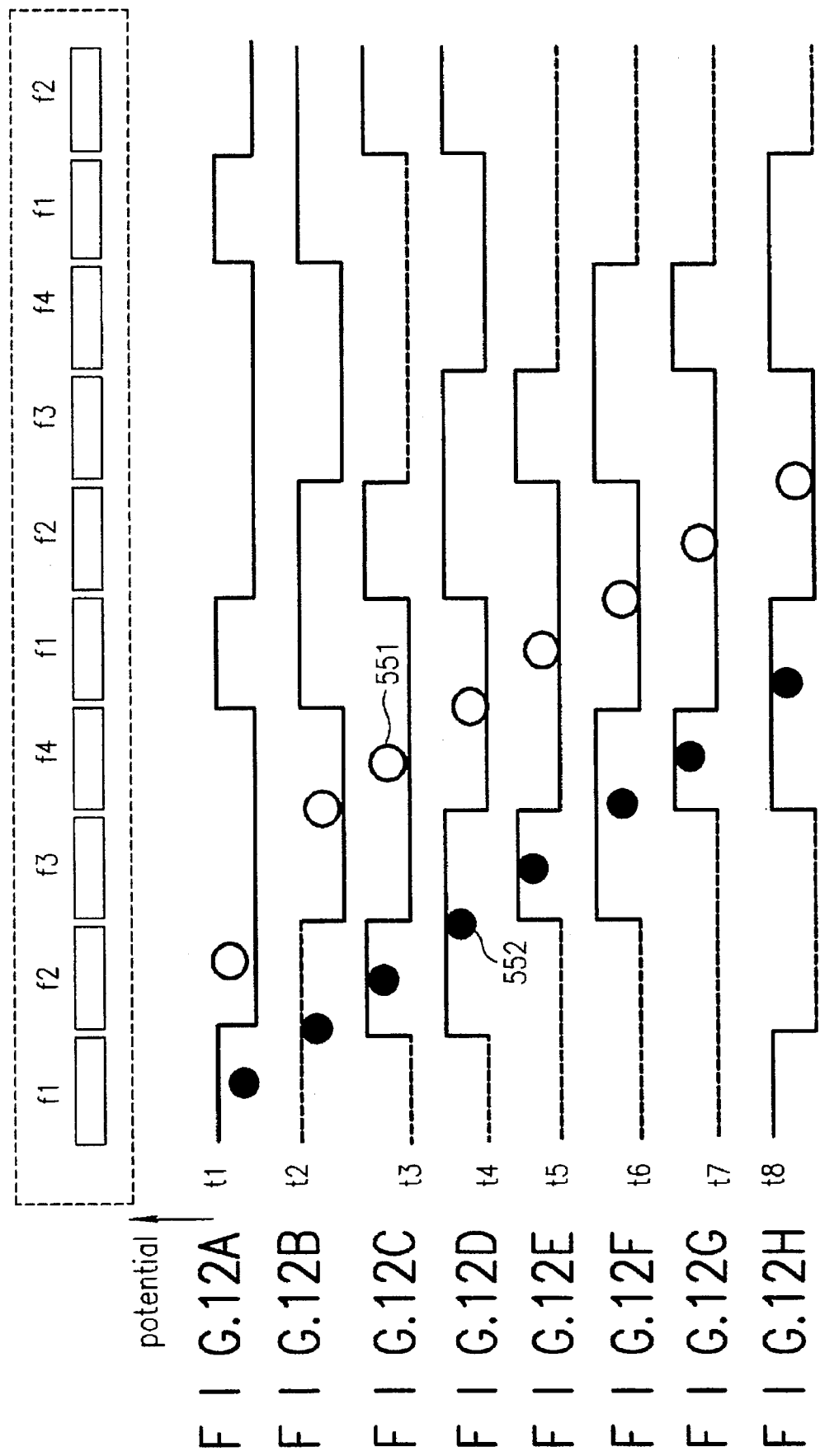

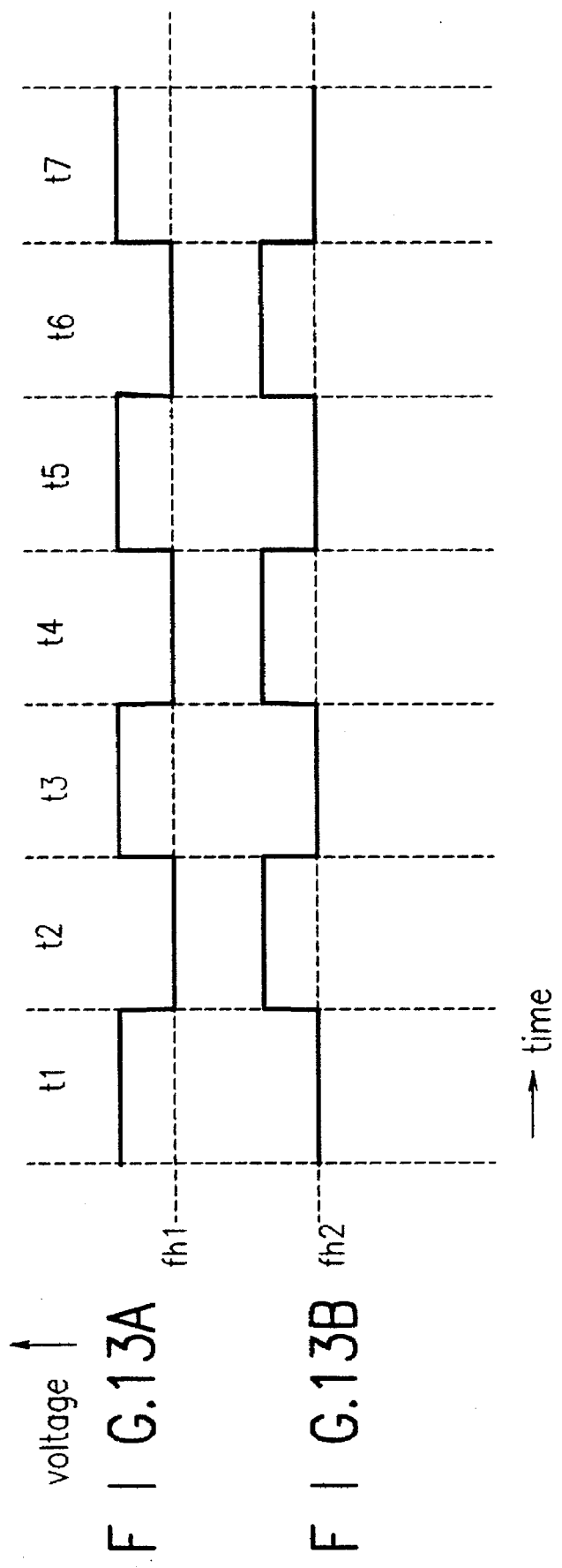

CCD-SOLID STATE IMAGE SENSOR USING ELECTRON AND HOLE SIGNAL CHARGES AND METHOD FOR PROCESSING SIGNAL THEREOF

BACKGROUND OF THE INVENION

1. Field of the Invention

This invention relates to a CCD (Charge Coupled Device) solid state image sensor.

2. Discussion of the Related Art

In general, electron-hole pairs generated in response to incident light, CCD-solid state image sensors have selected, accumulated, and transferred only one side of the pairs (i.e., either electrons or holes) as signal charges, while quickly removing the other unselected signal charges as unnecessary charges. Since the mobility of an electron is greater than that of a hole, the electron is generally the signal charge.

FIG. 1 illustrates a block diagram of a frame transfer type CCD-solid state image sensor. The frame transfer type CCD-solid state image sensor includes a sensing area 11 for generating signal charges in response to incident light, a storage area 12 for storing the signal charges from the sensing area 11 for a certain period, an HCCD (Horizontal Charge Coupled Device) 13 for extracting the stored signal charges from the storage area 12 line by line, a charge detection and amplification circuit 14 for detecting and amplifying signal charges transferred from the HCCD 13.

The sensing area 11 of the frame transfer type CCD-solid state image sensor generates signal charges in response to incident light and accumulates them for a certain time period.

The signal charges accumulated in the sensing area 11 are transferred to the storage area 12 at one time during a vertical erasing period for a storage therein. The signal charges are extracted and transferred to the HCCD 13 line by line before the next vertical erasing period. Upon the extraction of the stored signal charges from the storage area 12, the aforementioned operation is repeated, i.e., the accumulated signal charges in the sensing area are transferred to the storage area again.

Because the signal charges are electrons, a signal detection and amplification circuit adapted for electrons is used as the signal detection and amplification circuit 14.

FIG. 2 is a sectional illustration of the storage area 12 in the frame transfer type CCD-solid state image sensor. Though a sectional illustration of the storage area 12 in the frame transfer type CCD-solid state image sensor has only been shown, the sensing area 11 and the storage area 12 have almost identical sections, except the storage area 12 has a light-shielding layer of aluminum to shield incident light and a transfer electrode, while sensing area 11 does not so that it may generate signal charges in response to incident light.

Referring to FIG. 2, the storage area 12 in the frame transfer type CCD-solid state image sensor includes an $n^-$ type substrate 121, a $p^-$ type well 122 formed in the $n^-$ type substrate 121, an n type buried channel region 123 formed in the $p^-$ type well 122, channel stop regions 124 formed in the $p^-$ type well 122 in contact with the n type buried channel region 123, an insulation film 125 formed of $SiO_2$ on the substrate 121, and a transfer electrode 126 formed on the insulation film 125.

FIGS. 3A and 3B are sectional illustrations across lines 2A-2A' and 2B-2B', respectively, and FIG. 3C shows potential profiles across lines 2A-2A' and 2B-2B'.

As shown in FIG. 3C with line 132, the signal charges generated in the sensing area 11 in response to incident light are accumulated in the n type buried channel region 123. As shown in FIG. 3C with a line 131, the holes are gathered in the $p_+$ type channel stop regions 124 through an interface between the substrate 121 and the insulation film 125, i.e., $Si/SiO_2$, and dissipated through structures around them.

As has been explained, the holes are taken as unnecessary signal charges. The holes have not been considered in the CCD-solid state image sensor except to remove them within a short period so that they do not affect the transfer of the electrons.

FIG. 4 illustrates a graph showing photoelectric transfer characteristics of the CCD-solid state image sensor, with the CCD surface illuminance on the X-axis and the CCD output voltage on the Y-axis. A dynamic range of a CCD is generally defined as tile linear range where the illuminance and the output voltage are proportional, and a sensitivity of a solid state image sensor is represented by the slope (mV/LUX) of the linear range.

Therefore, as shown in FIG. 4, a solid state image sensor with a sensitivity characteristic of A has twice the sensitivity of a solid state image sensor with a sensitivity characteristic of B. However, in view of the illuminance dynamic range, the solid state image sensor B has a wider dynamic range than the solid state image sensor A.

In order to match the dynamic range of sensor B, the maximum voltage of sensor A should be doubled. However, doubling the voltage is not practical because of limitations on both the driving voltage of the CCD and the input voltage to a video signal processing circuit.

Even if there was a technique that could detect charges with a sensitivity 10 times greater, the aforementioned problem of illuminance dynamic range in utilizing the technique would still exist. That is, even though the highly sensitive charge detection technique would be useful under very low illuminance, in the case of a picture with sharp contrast, or of a very bright outdoor landscape under daylight, the contrast becomes indistinct for portions with illuminances greater than a certain amount which become completely white.

Matching both the driving voltage and the signal processing circuit voltage to a maximum output voltage predetermined to be 10 times greater is theoretically and actually not possible.

As a result, a solid state image sensor that can detect and amplify charges with high sensitivity in low illuminance regions and with low sensitivity in high illuminance regions is needed.

SUMMARY OF THE INVENTION

The present invention has been made in view of the above circumstances and has as an object to provide a CCD-solid state image sensor which can detect signals with high sensitivity in low illuminance regions and with low sensitivity in high illuminance regions using both charges of an electron-hole pair as signal charges.

It is a further object of the present invention to provide a method for processing signals of the CCD-solid state image sensor capable of detecting signals with high sensitivity in low illuminance regions.

Another object of this invention is to provide a CCD-solid state image sensor which can make a high sensitivity and a wide illuminance dynamic range compatible.

It is a further object of the invention to provide a method for processing signals of the CCD-solid state image sensor having a high sensitivity and wide dynamic range.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the CCD-solid state image sensor of this invention comprises a sensing area for generating signal charges in response to incident light, a storage area for storing the signal charges from the sensing area, an HCCD (Horizontal Charge Coupled Device) for extracting the signal charges stored in the storage area, a high sensitivity signal charge detection and amplification circuit for detecting and amplifying signal charges of electrons from the HCCD, and a low sensitivity signal charge detection and amplification circuit for detecting and amplifying signal charges of holes from the HCCD.

To further achieve the objects and in accordance with the purpose of the invention, as embodied and broadly described herein, the method for processing signals of a CCD-solid state image sensor of this invention comprises the steps of generating signal charges of electrons and holes in response to incident light, storing the generated signal charges, extracting the stored signal charges, detecting signal charges of electrons, detecting signal charges of holes, and composing the detected signal charges of the electrons and the holes.

BRIEF DESCRIPTION OF THE DRAWINGS

The accompanying drawings, which are incorporated in and constitute a part of this specification, illustrate embodiments of the invention and, together with the description, serve to explain the objects, advantages and principles of the invention. In the drawings:

FIG. 1 is a block diagram of a frame transfer type CCD-solid state image sensor;

FIG. 2 is a sectional illustration of the storage area of the frame transfer type CCD-solid state image sensor of FIG. 1;

FIGS. 3A to 3B are sectional illustrations across lines 2A-2A' and 2B-2B' of FIG. 2;

FIG. 3C is a potential profile of the sections illustrated in FIGS. 3A and 3B;

FIG. 5 is a block diagram of a frame transfer type CCD-solid state image sensor in accordance with a preferred embodiment of the present invention;

FIGS. 8A and 8B are sectional illustrations across lines 5A-5A' and 5B-5B' of FIG. 6A;

FIG. 8C is conduction band profiles of the sections illustrated in FIGS. 8A and 8B;

FIGS. 9A and 9B are sectional illustrations across lines 5A-5A' and 5B-5B' of FIG. 6A, and FIG. 9C is a valance band profile of those sections;

FIG. 10A is a sectional illustration across line 5C-5C' in FIG. 6A;

FIGS. 11A–11D illustrate wave patterns of 4-phase driving clock signals adopted for the CCD-solid state image sensor in accordance with the preferred embodiment of this invention;

FIGS. 12A–12H illustrate potential distributions in each cycle in accordance with a preferred embodiment of the present invention;

FIGS. 13A–13B illustrate wave patterns of 2-phase driving clock signals adapted for the CCD-solid state image sensor in accordance with a preferred embodiment of the present invention;

DETAILED DESCRIPTION OF THE INVENTION

A preferred embodiment of the invention will now be described with reference to the accompanying drawings.

Referring to FIG. 5, a frame transfer type CCD-solid state image sensor in accordance with a preferred embodiment of the present invention includes a sensing area 51 for generating signal charges in response to incident light, a storage area 52 for storing the signal charges from the sensing area 51 for a certain time period, an HCCD 53 for extracting the signal charges stored in the storage area 52 line by line, a high sensitivity signal charge detection and amplification circuit 54 for detecting and amplifying the signal charges of electrons received from the HCCD 53, and a low sensitivity signal charge detection and amplification circuit 55 for detecting and amplifying the signal charges of holes received from the HCCD 53.

In the frame transfer type CCD-solid state image sensor in accordance with a preferred embodiment of the present invention having a system as shown in FIG. 5, the sensing area 51 generates signal charges, i.e., electrons and holes in response to incident light, and accumulates the generated signal charges for a certain time period. The accumulated signal charges in the sensing area 51 are transferred to and stored in the storage area 52 during a vertical erasing period. The signal charges are extracted and transferred to the HCCD 53 line by line before the next vertical erasing period. Once all of the signal charges stored in the storage area 52 have been extracted, the above operation is repeated, i.e., the signal charges generated and accumulated in the sensing area 51 and then are transferred to the storage area 52.

When the signal charges transferred to the HCCD 53, the electrons are detected and processed into signals through the high sensitivity signal charge detection and amplification circuit 54, and the holes are detected and processed into signals through the low sensitivity signal charge detection and amplification circuit 55.

Figure 6A:
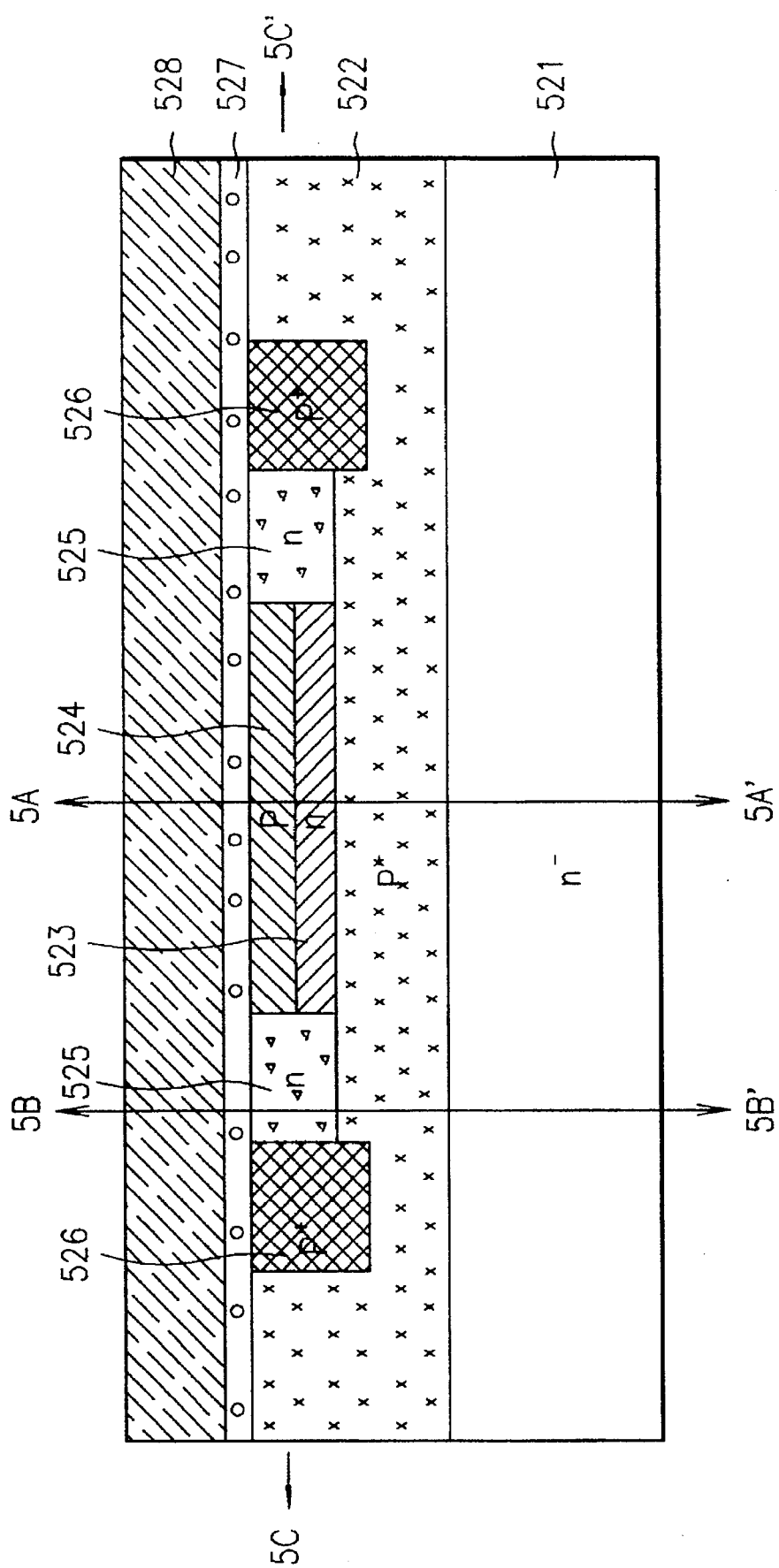
FIGS. 6A and 6B are sectional illustrations of the storage area of the frame transfer type CCD-solid state image sensor in accordance with a preferred embodiment of the present invention.
Figure 6B:
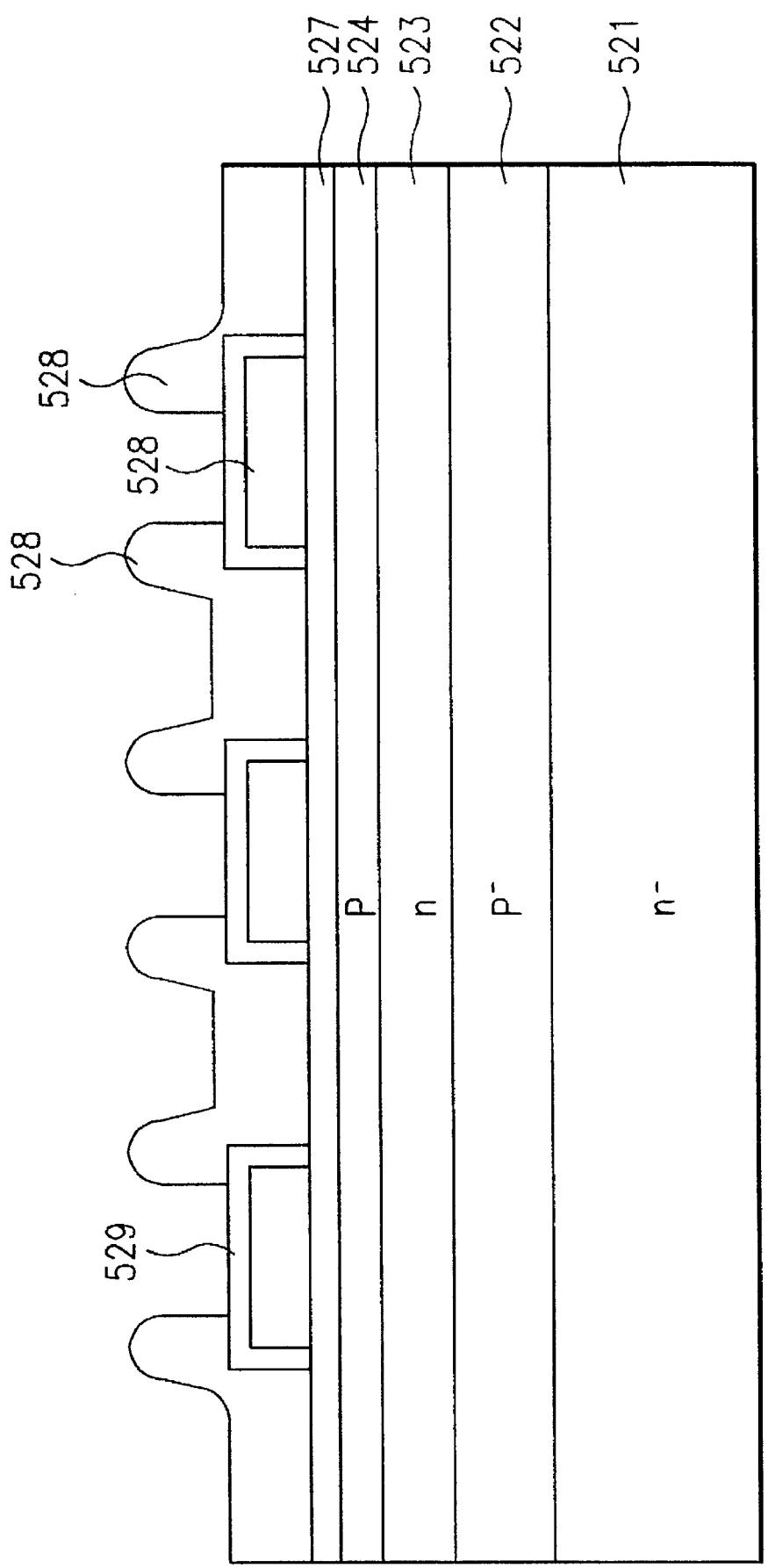

FIGS. 6A and 6B are sectional illustrations of the storage area 52 of the frame transfer type CCD-solid state image sensor in FIG. 5. In particular, FIG. 6A is a sectional illustration in a direction vertical to a transfer direction of the signal charges, and FIG. 6B is a sectional illustration in a direction parallel to the transfer direction of the signal charges.

Even though only the storage area 52 of the frame transfer type CCD-solid state image sensor in accordance with one preferred embodiment of this invention has been shown in FIGS. 6A and 6B, the sensing area 51 and the storage area 52 have almost identical sections. In particular, the storage area 52 has a light-shielding layer of aluminum for shielding incident light thereto and a transfer electrode, while the sensing area 51 does not so that it may generate signal charges in response to incident light.

Referring to FIGS. 6A and 6B, the storage area 52 of the frame transfer type CCD-solid state image sensor in accordance with one preferred embodiment of this invention includes an $n^-$ type substrate 521, a $p^-$ type well 522 formed in the $n^-$ type substrate 521, a first n type region 523 formed in the $p^-$ type well 522 as a buried channel region for electrons, a p type region 524 formed in a surface of the n type region 523 as a buried channel region for holes, second n type regions 525 formed in the $p^-$ type well 522 each in contact with the first n type region 523 and the p type region 524 as a channel stop region for holes and a buried channel region for electrons, $p_+$ type regions 526 formed in the $p^-$ type well 522 each in contact with one of the second n type regions 525 as a channel stop region for electrons and a drain region for holes, an insulation film 527 formed of $SiO_2$, for example, on the substrate, a transfer electrode 528 formed on the insulation film 527, and an insulator 529. Though not shown in FIGS. 6A and 6B, a light-shielding layer is formed on the transfer electrode 528.

Figures 7A, 7B:
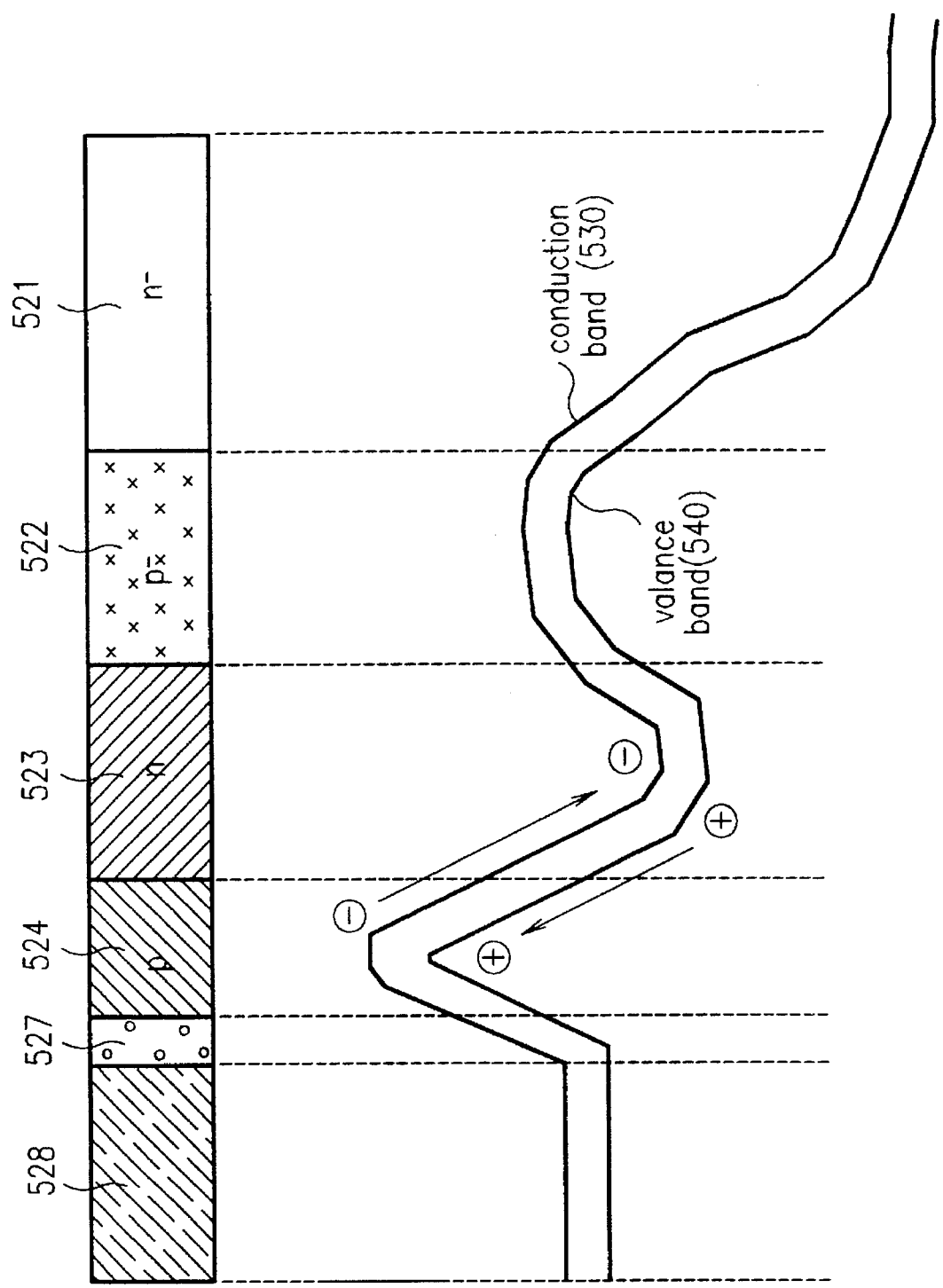
FIG. 7A is a sectional illustration across line 5A-5A' of FIG. 6A.
FIG. 7B is a band diagram of the section illustrated in FIG. 7A.

FIG. 7A is a sectional illustration across line 5A-5A' of FIG. 6A, FIG. 7B is a band diagram of that section, FIGS. 8A and 8B are sectional illustrations across lines 5A-5A' and 5B-5B' of FIG. 6A, and FIG. 8C illustrates conduction band profiles of sections across lines 5A-5A' and 5B-5B' of FIG. 6A.

As shown in FIG. 8C with lines 531 and 532, when the signal charges are generated in response to incident light, the electrons are stored in the first n type region 523 which acts as an electron buried channel region of the storage area 52. If there is an excess of electrons generated beyond the capacity of the first n type region 523, a potential barrier of the $p^-$ type well 522 overflows to drain off through the $n^-$ type substrate 521. Therefore, the CCD-solid state image sensor of this invention is provided with a vertical overflow drain structure for electrons.

FIGS. 9A and 9B are sectional illustrations across lines 5A-5A' and 5B-5B' of FIG. 6A, and FIG. 9C illustrates valance band profiles of those sections. Referring to FIGS. 9A and 9B, the second n type regions 525 act as channel stop regions for holes and the p type region 524 acts as a buried channel region for holes.

Figure 10B:
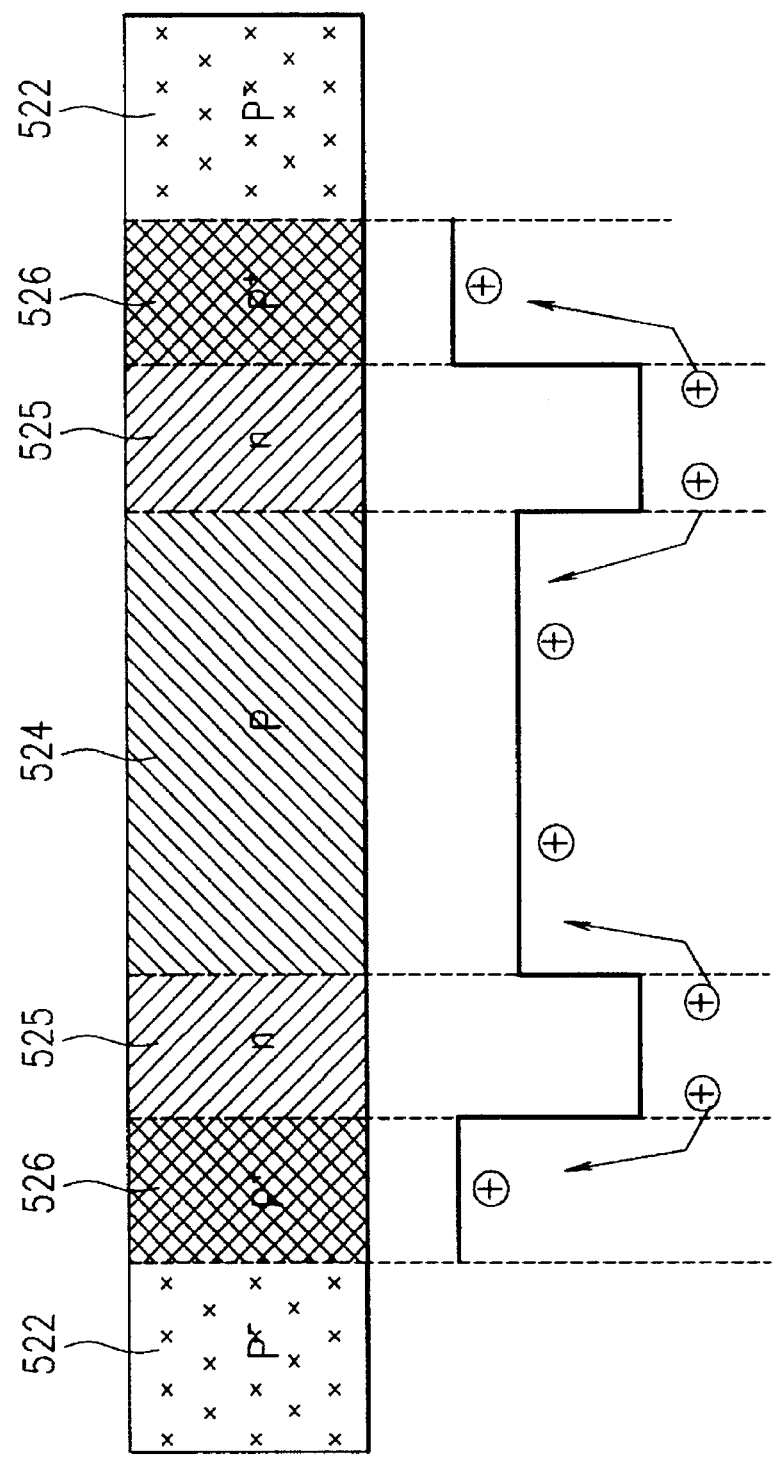
FIG. 10B is a valance band profile of the section illustrated in FIG. 10A.
Figures 14A, 14B, 14C, 14D:
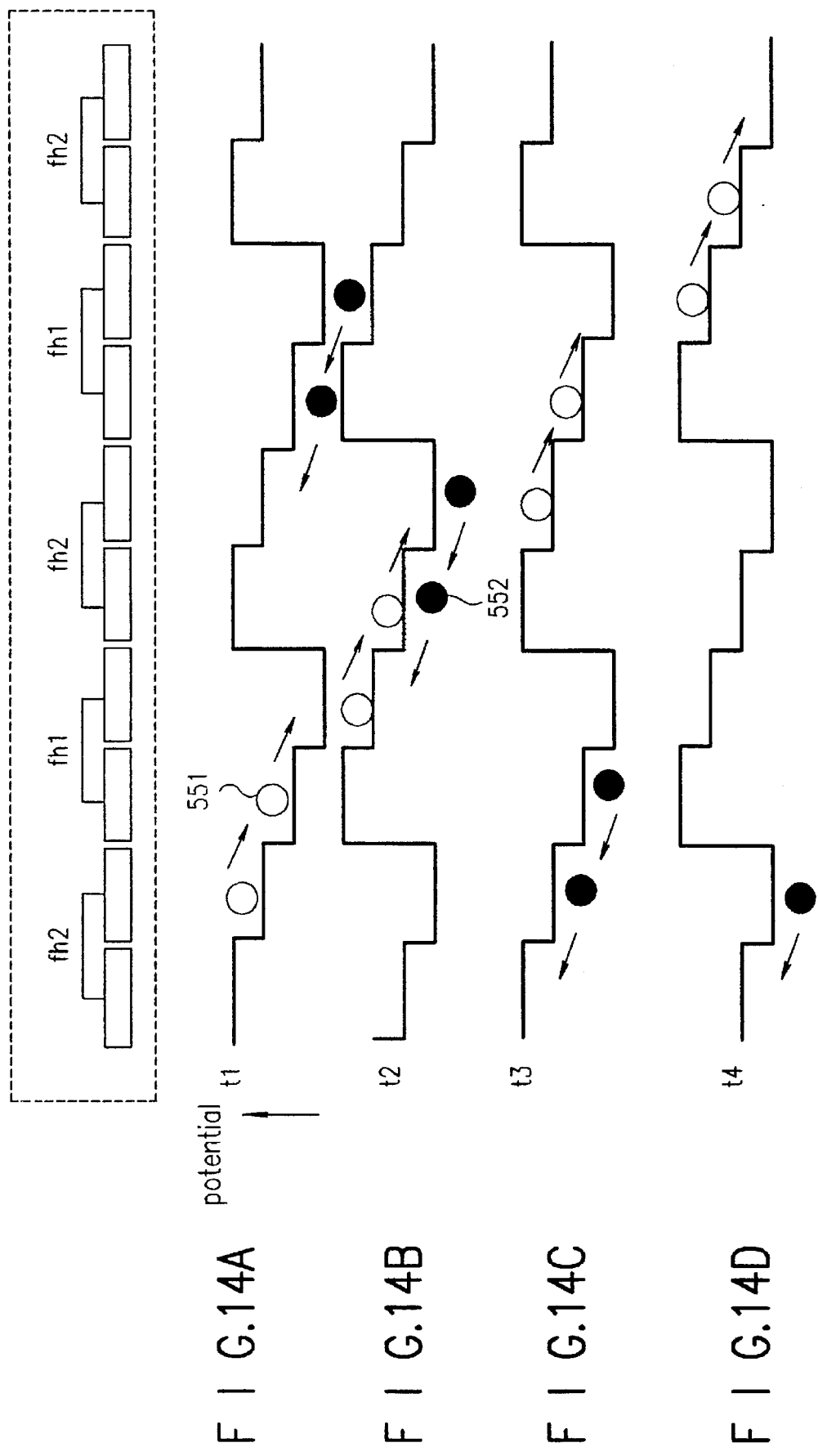
FIGS. 14A–14D illustrate potential distributions in each cycle in accordance with a preferred embodiment of the present invention.

FIG. 10A is a sectional illustration across line 5C-5C' of FIG. 6A, and FIG. 10B illustrates a valance band profile of that section. If a voltage is applied to the transfer electrode 528 and the substrate 521 is appropriately controlled, a valance profile along line 5C-5C' of FIG. 6A as shown in FIG. 10B is obtained.

Of the signal charges generated in response to incident light, the holes are stored in the p type region 524 that acts as a hole buried channel region of the storage area 52 as shown in FIG. 10B, the $p_+$ type regions 526 act as horizontal overflow drains for holes.

Therefore, in a period when there is no sensitivity to the electrons, a high positive voltage is applied to the $n^-$ type substrate 521. Since no electrons can be stored in the first n type region 523 in this period due to the positive voltage, the first n type region 523 does not act as a buried channel region for the electrons within this period. Therefore, the electrons generated in response to incident light are not stored in the first n type region 523 but are entirely drained off through the $n^-$ type substrate 521 in the period when there is no sensitivity to the electrons.

A negative voltage is applied to the transfer electrode 528 in the period when there is no sensitivity to the holes. As no holes are stored in the p type region 524 due to the negative voltage applied to the transfer electrode 528 in the duration, the p type region does not act as a buried channel region for the holes. Therefore, the holes generated in response to incident light are not stored in the p type region 524 but are entirely drained off through the $p_+$ type regions 526 in the period when there is no sensitivity to the holes.

In the transfer of charge, application of either the 4-phase driving type or the 2-phase driving type to the CCD-solid state image sensor of this invention is possible.

FIGS. 11A–11D illustrate wave patterns of 4-phase driving clock signals, and FIGS. 12A–12H illustrate potential distributions in each cycle. As shown in FIGS. 12A–12H, both the electrons 551 and the holes 552 are transferred in the same direction if 4 phase driving is used by the CCD-solid state image sensor of this invention.

FIGS. 13A–13B illustrate wave patterns of 2-phase driving clock signals, and FIGS. 14A–14D illustrate potential distributions in each cycle. As shown in FIGS. 14A–14D, if 2-phase driving is used by the CCD-solid state image sensor of this invention, the electrons 551 and the holes 552 are transferred in opposite directions. Utilizing this characteristic of the electrons and the holes being transferred in opposite directions in 2-phase driving, separation of electrons from holes is possible.

As has been explained, because utilization of not only the electrons but also the holes as signal charges almost doubles the total signal charges, a significant improvement in the sensitivity of the CCD-solid state image sensor is possible in accordance with this invention.

That is, with the signal charge detection and amplification circuit for the electrons set for high sensitivity and with the signal charge detection and amplification circuit for the holes set for low sensitivity, by switching between the two kinds of charges, a CCD camera can be effective in both high and low illuminance photography.

Figure 4:
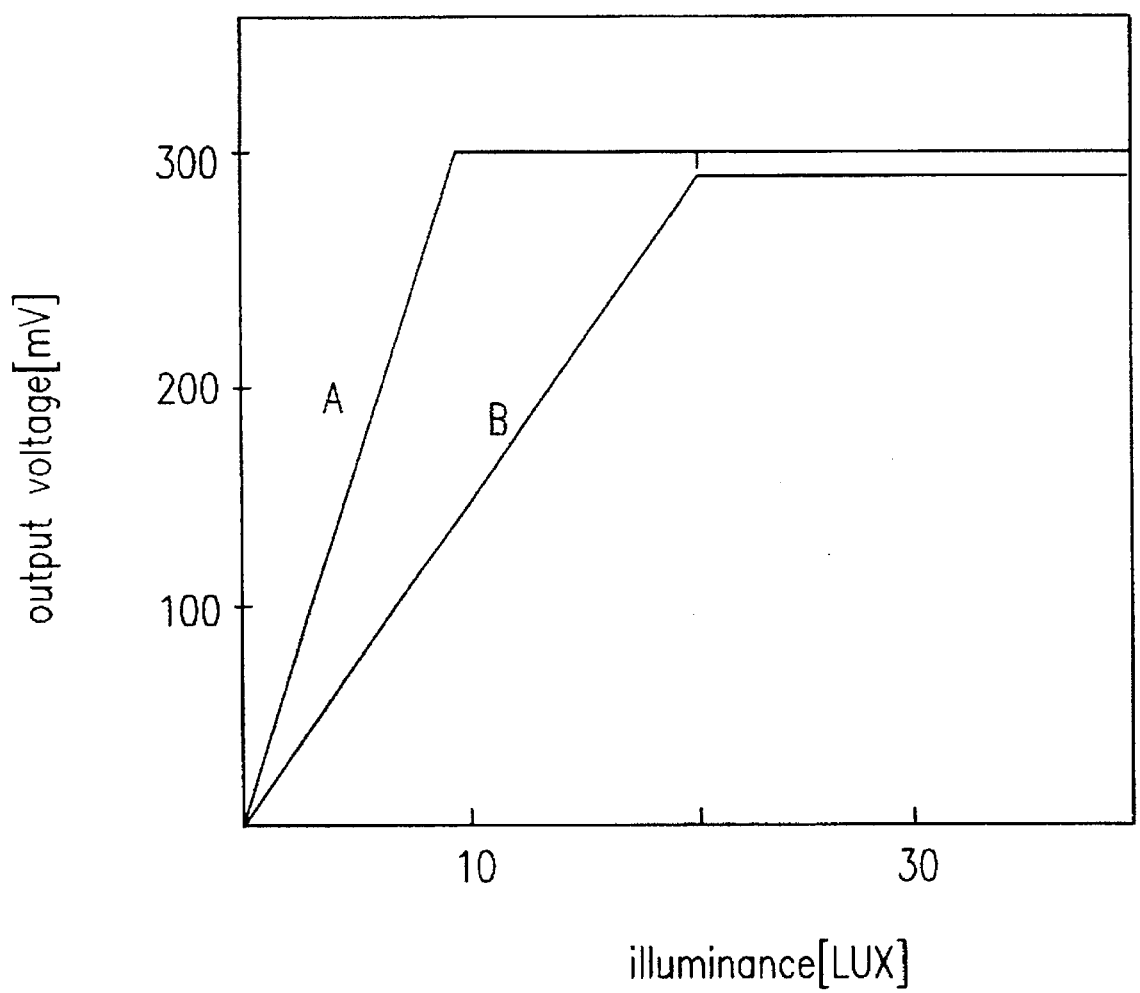
FIG. 4 is a plot of the photoelectric transfer characteristics of a generic CCD-solid state image sensor.
Figure 15:
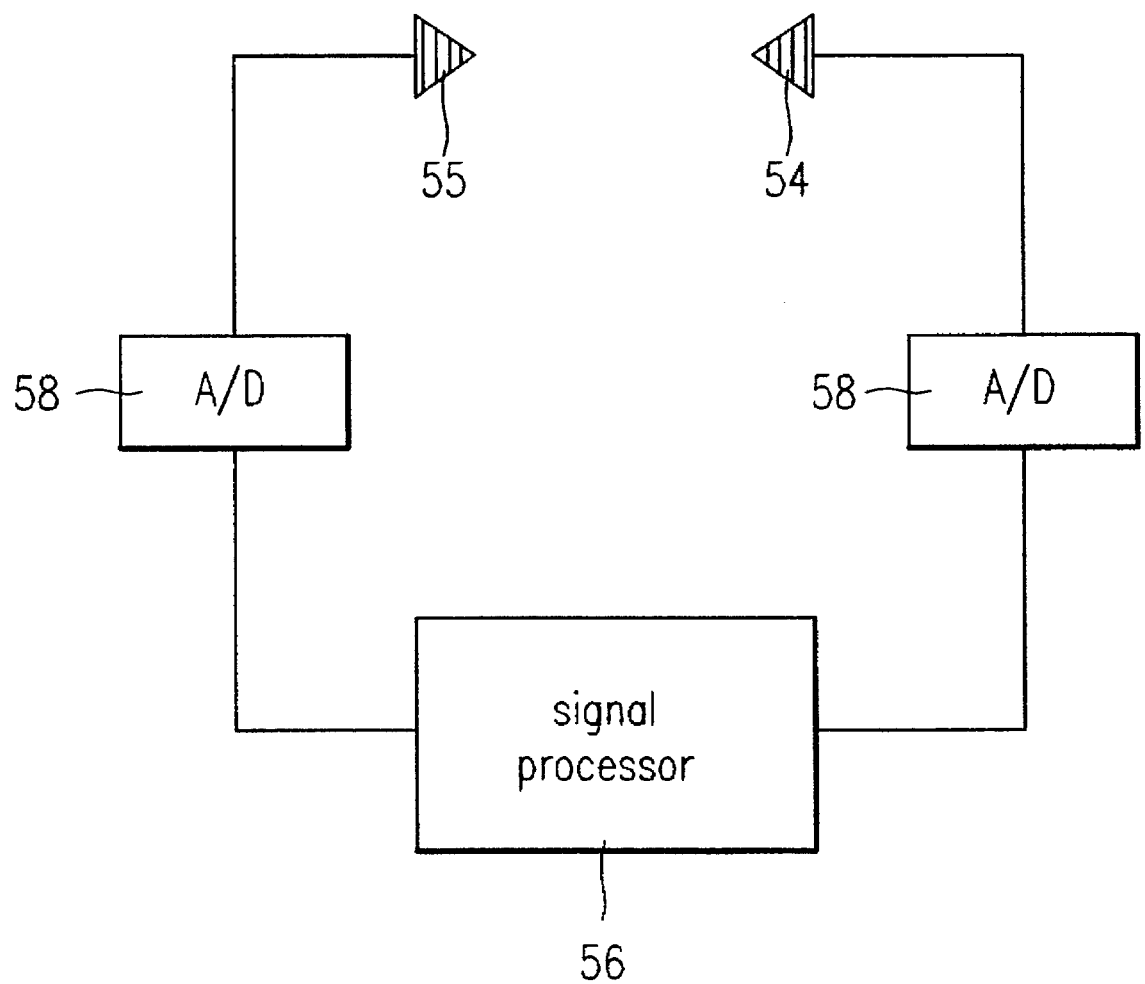
FIG. 15 is a block diagram of the signal processor connected to the signal charge detection and amplification circuits in accordance with a preferred embodiment of the present invention.

Moreover, with the signal charge detection and amplification circuit for the electrons set for high sensitivity and with the signal charge detection and amplification circuit for the holes set for low sensitivity, if the two kinds of signals are composed on the same frame using an analog/digital converter 58 and a digital signal processor 56 as shown in FIG. 15, an image can be obtained that has a wider illuminance dynamic range and is higher in sensitivity than with other techniques. This is to be explained hereinafter, referring to FIG. 4 showing photoelectric transfer characteristics of the CCD-solid state image sensor.

For example, assuming that A and B are characteristics of an output sensitivity of an electron signal and an output signal of a hole respectively, the composite sensitivity characteristic is defined as C=A+B.

In this case, in a low illuminance region, a new sensitivity of the CCD-solid state image sensor of this invention is an electron signal sensitivity received from the high sensitivity circuit added to a hole signal sensitivity received from the low sensitivity circuit. Therefore, in this case, the CCD-solid state image sensor of this invention can obtain a sensitivity slightly higher than the case when only an electron signal sensitivity is used as previously known.

On the other hand, in a high illuminance region, since the electron signal sensitivity of the CCD-solid state image sensor of this invention has been saturated, only a hole signal sensitivity from the low sensitivity circuit is obtained. Therefore, the CCD-solid state image sensor of this invention can realize an illuminance dynamic range twice as wide as the case when only an electron signal sensitivity is used with the conventional CCD-solid state image sensor.

As has been explained, by utilizing both the electrons and the holes as signal charges, this invention enables a CCD-solid state image sensor to take pictures of an object with high sensitivity at low illuminance and with low sensitivity at high illuminance.

The CCD-solid state image sensor of this invention uses both the electrons and the holes as signal charges. Consequently, the sensitivity is improved due to the addition of the hole signals to the electron signals, thereby increasing the total signals.

Furthermore, by detecting the electron signals and the hole signals at the same time, with separate signal charge detection and amplification circuits of different sensitivities connected to the electrons and the holes, the dynamic range for incident Light is wider. Thus, the sensitivity of the sensor is improved.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A CCD-solid state image sensor, comprising:
   a sensing area for generating signal charges in response to incident light;
   a storage area for storing the signal charges from the sensing area;
   a horizontal charge coupled device for extracting the signal charges stored in the storage area;
   a high sensitivity signal charge detection and amplification circuit for detecting and amplifying signal charges of electrons from the horizontal charge coupled device; and
   a low sensitivity signal charge detection and amplification circuit for detecting and amplifying signal charges of holes from the horizontal charge coupled device.

2. The CCD-solid state image sensor of claim 1, wherein the sensing area includes:
   a low density substrate of a first conductivity type;
   a well of a second conductivity type formed in the substrate;
   a first impurity region of the first conductivity type formed in the well;
   a second impurity region of the second conductivity type formed in a surface of the first impurity region;
   third impurity regions of the first conductivity type formed in the well in contact with the first and second impurity regions; and
   fourth impurity regions of the second conductivity type formed in the well in contact with the third impurity regions.

3. The CCD-solid state image sensor of claim 2, wherein the sensing area further includes an insulation film formed on the surface of the substrate.

4. The CCD-solid state image sensor of claim 1, wherein the storage area includes:
   a low density substrate of a first conductivity type;
   a well of a second conductivity type formed in the substrate;
   a first impurity region of the first conductivity type formed in the well;
   a second impurity region of the second conductivity type formed in a surface of the first impurity region;
   third impurity regions of the first conductivity type formed in the well in contact with the first and second impurity regions; and
   fourth impurity regions of the second conductivity type formed in the well in contact with the third impurity regions.

5. The CCD-solid state image sensor of claim 4, wherein the storage area further includes:
   an insulation film formed on the surface of the substrate;
   a transfer electrode formed on the insulation film; and
   a light-shielding layer formed on the transfer electrode.

6. The CCD-solid state image sensor of claim 4, wherein the first impurity region serves as a buried channel region for electrons.

7. The CCD-solid state image sensor of claim 4, wherein the second impurity region serves as a buried channel region for holes.

8. The CCD-solid state image sensor of claim 4, wherein the third impurity region serves as a channel stop region for holes and a buried channel region for electrons.

9. The CCD-solid state image sensor of claim 4, wherein the fourth impurity region serves as a channel stop region for electrons and a drain region for holes.

10. A method for processing signals of a CCD-solid state image sensor comprising the steps of:
    generating signal charges of electrons and holes in response to incident light;
    storing the generated signal charges;
    extracting the stored signal charges;
    detecting signal charges of electrons;
    detecting signal charges of holes; and
    composing the detected signal charges of the electrons and the holes.

11. The method of claim 10, wherein the step of composing the detected signals of electrons and holes includes a step of outputting a value corresponding to a sum of detected electrons and holes in a low illuminance region.

12. The method of claim 10, wherein the step of composing the detected signals of electrons and holes includes a step of outputting a value corresponding to detected holes in a high illuminance region.

13. The method of claim 10, wherein the step of extracting the stored signal charges includes a step of transferring the electrons and holes in opposite directions.

14. The method of claim 10, wherein the step of extracting the stored signal charges includes a step of applying 2-phase driving signals.

15. The method of claim 10, wherein the step of detecting signal charges of electrons includes a step of detecting a signal of a high sensitivity circuit.

16. The method of claim 10, wherein the step of detecting signal charges of holes includes a step of detecting a signal of a low sensitivity circuit.

17. A method for processing signals of a CCD-solid state image sensor comprising the steps of:

generating signal charges of electrons and holes in response to incident light on a sensing area;

storing the generated signal charges in a storage area;

extracting the stored signal charges from the storage area into a horizontal charge coupled device;

detecting signal charges of electrons with a high sensitivity signal charge detection and amplification circuit; and detecting signal charges of holes with a low sensitivity signal charge detection and amplification circuit.

18. The method of claim 17, further comprises the steps of composing the detected signal charges of electrons and holes, outputting a value corresponding to a sum of detected electrons and holes in a low illuminance region, and outputting a value corresponding to detected holes in a high illuminance region.

19. The method of claim 17, wherein the step of extracting the stored signal charges includes a step of transferring the electrons and holes in opposite directions.

20. The method of claim 17, wherein the step of extracting the stored signal charges includes a step of applying a 2-phase driving signals.

* * * * *